(12) United States Patent
Huang et al.

(10) Patent No.: US 8,598,866 B2
(45) Date of Patent: Dec. 3, 2013

(54) ZERO BIAS POWER DETECTOR

(75) Inventors: Chun-Yen Huang, Beigang Township, Yunlin County (TW); Chin-Chung Nien, Hsinchu (TW); Jenn-Hwan Tarng, Hsinchu (TW); Chen-Ming Li, Bade (TW); Li-Yuan Chang, Taipei (TW); Ya-Chung Yu, Chiayi (TW)

(73) Assignee: Industrial Technology Research Institute, Hsinchu (TW)

( * ) Notice: Subject to any disclaimer, the term of this patent is extended or adjusted under 35 U.S.C. 154(b) by 339 days.

(21) Appl. No.: 12/955,602

(22) Filed: Nov. 29, 2010

(65) Prior Publication Data

US 2012/0062212 A1    Mar. 15, 2012

(30) Foreign Application Priority Data

Sep. 10, 2010   (TW) ................................ 99130760 A

(51) Int. Cl.
    *G01R 13/00*      (2006.01)

(52) U.S. Cl.
    USPC ...... 324/140 R; 324/95; 324/119; 455/253.2; 455/127.1; 455/246.1; 455/251.1; 327/313; 327/283; 327/61

(58) Field of Classification Search
    USPC .................................................. 324/140 R
    See application file for complete search history.

(56) References Cited

U.S. PATENT DOCUMENTS

| | | | |
|---|---|---|---|
| 3,647,845 A | 3/1972 | Wilkes | |
| 4,647,845 A | 3/1987 | Richter et al. | |
| 4,647,848 A * | 3/1987 | Barrett | 324/95 |
| 4,937,521 A * | 6/1990 | Yoshino et al. | 324/117 R |
| 5,446,366 A | 8/1995 | Bassett et al. | |
| 6,204,727 B1 * | 3/2001 | Wey et al. | 329/370 |
| 6,291,982 B1 | 9/2001 | Prabhu | |
| 6,531,860 B1 * | 3/2003 | Zhou et al. | 324/105 |
| 6,683,471 B2 | 1/2004 | Ratni et al. | |
| 6,710,716 B1 | 3/2004 | Abe et al. | |
| 7,046,091 B2 * | 5/2006 | Koimori et al. | 330/289 |
| 7,990,221 B2 * | 8/2011 | Koizumi et al. | 330/285 |
| 8,278,963 B2 | 10/2012 | Rabjohn et al. | |
| 2005/0248384 A1 | 11/2005 | Miettinen | |
| 2009/0261863 A1 * | 10/2009 | Kurihara | 327/89 |
| 2010/0277003 A1 * | 11/2010 | Von Novak et al. | 307/104 |

(Continued)

FOREIGN PATENT DOCUMENTS

| CN | 101477147 A | 7/2009 |
|---|---|---|
| CN | 101778502 A | 7/2010 |

(Continued)

OTHER PUBLICATIONS

English language translation of abstract of TW 200522335 (published Jul. 1, 2005).

(Continued)

*Primary Examiner* — Jermele M Hollington
*Assistant Examiner* — Thang Le
(74) *Attorney, Agent, or Firm* — McClure, Qualey & Rodack, LLP

(57) ABSTRACT

A zero bias power detector comprising a zero bias diode and an output boost circuit is provided. The output boost circuit comprises a zero bias transistor. The zero bias diode is not biased but outputs a rectifying signal according to a wireless signal. The zero bias transistor, not biased but coupled to the zero bias diode, is used for enhancing the rectifying signal.

9 Claims, 8 Drawing Sheets

(56) References Cited

U.S. PATENT DOCUMENTS

| | | | |
|---|---|---|---|
| 2011/0006616 A1* | 1/2011 | Hilgers | 307/140 |
| 2011/0026284 A1 | 2/2011 | Sutardja et al. | |
| 2011/0037519 A1* | 2/2011 | Pletcher et al. | 330/277 |

FOREIGN PATENT DOCUMENTS

| | | |
|---|---|---|
| JP | 04155981 | 5/1992 |
| TW | 245057 | 4/1995 |
| TW | M247833 | 10/2004 |
| TW | 200522335 | 7/2005 |
| TW | 200917646 A | 4/2009 |
| TW | 200950290 A | 12/2009 |
| WO | 2009109889 A1 | 9/2009 |

OTHER PUBLICATIONS

Zhou, Q., et al.; "Wide-Dynamic-Range Zero-Bias Microwave Detector Using AlGaN/GaN Heterojunction Field-Effect Diode;" IEEE Microwave and Wireless Components Letters; vol. 20; No. 5; May 2010; pp. 277-279.

Schulman, J.N., et al.; "InGaAs Zero Bias Backward Diodes for Millimeter Wave Direct Detection;" IEEE Electron Device Letters; vol. 22; No. 5; May 2001; pp. 200-202.

Chahal, P., et al.; "Zero Bias Resonant Tunnel Schottky Contact Diode for Wide-Band Direct Detection;" IEEE Electron Device Letters; vol. 26; No. 12; Dec. 2005; pp. 894-896.

Jin, N., et al; "High Sensitivity Si-Based Backward Diodes for Zero-Biased Square-Law Detection and the Effect of Post-Growth Annealing on Performance;" IEEE Electron Device Letters; vol. 26; No. 8; Aug. 2005; pp. 575-578.

English Abstract translation of TW200917646 (Published Apr. 16, 2009).

English Abstract translation of JP04155981 (Published May 28, 1992).

TW Office Action mailed Mar. 6, 2013.

English Abstract translation of CN101477147 (Published Jul. 8, 2009).

English machine translation of CN101778502 (Published Jul. 14, 2010).

CN Office Action dated Jun. 8, 2013.

TW Office Action dated Jul. 25, 2013.

English Abstract translation of TW200950290 (Published Dec. 1, 2009).

English Abstract translation of TW245057 (Published Apr. 11, 1995).

* cited by examiner

ZERO BIAS POWER DETECTOR

This application claims the benefit of Taiwan application Serial No. 99130760, filed Sep. 10, 2010, the subject matter of which is incorporated herein by reference.

BACKGROUND OF THE APPLICATION

1. Technical Field

The disclosure relates in general to a power detector, and more particularly to a zero bias power detector.

2. Description of the Related Art

The power detector is an energy sensing element which is crucial to a wireless communication system and is most commonly used in a power amplifier. The power detector couples the power emitted from the output terminal of a power amplifier, and further feedbacks the power to the backend processor for monitoring and adjustment. Thus, the connection between the power amplifier and the base station is adapted according to the intensity and distance of the signal to assure that the maximum allowable transmission power is not exceeded and stable system efficiency is maintained.

Conventionally, the power detector can be divided into the zero bias power detector and the active type power detector. The zero bias power detector does not need to be biased, but the active type power detector needs to be biased. Referring to FIG. 1, a circuit diagram of a conventional zero bias power detector is shown. FIG. 1 shows a conventional zero bias power detector 40 disclosed in U.S. Pat. No. 3,647,845B1. The conventional zero bias power detector 40 couples the RF signal to a diode 74 through a capacitor 70 at the input terminal, and outputs a DC voltage according to the transduction capacity of the power of the diode 74 with respect to the current. The capacitor 100 pF, such as a low-pass filter, blocks the time-varying current component so that the output current contains the DC component only. The diode 74 is operated in a zero bias state without using any extra DC voltage, and the rectifying efficiency is dependent on the manufacturing process of the diode 74.

SUMMARY

The disclosure is directed to a zero bias power detector, which is not biased but is capable of enhancing the intensity of the output signal.

According to a first aspect of the present disclosure, a zero bias power detector comprising a zero bias diode and an output boost circuit is provided. The output boost circuit comprises a zero bias transistor. The zero bias diode is not biased but outputs a rectifying signal according to a wireless signal. The zero bias transistor, not biased but is coupled to the zero bias diode, is used for enhancing the rectifying signal.

The above and other aspects of the disclosure will become better understood with regard to the following detailed description of the preferred but non-limiting embodiment(s). The following description is made with reference to the accompanying drawings.

DETAILED DESCRIPTION

Several types of zero bias power detectors are disclosed in the following embodiments. The zero bias power detector comprises a zero bias diode and an output boost circuit. The output boost circuit comprises a zero bias transistor. The zero bias diode is not biased but outputs a rectifying signal according to a wireless signal. The zero bias transistor, not biased but coupled to the zero bias diode, is used for enhancing the rectifying signal.

Figure 2:
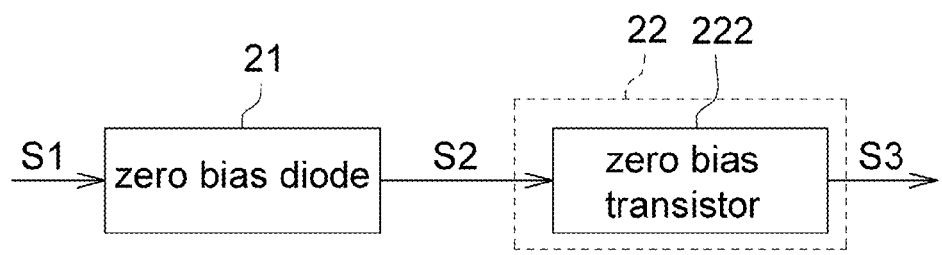
FIG. 2 shows a block diagram of a zero bias power detector.

Referring to FIG. 2, a block diagram of a zero bias power detector is shown. The zero bias power detector 2, such as an integrated circuit, comprises a zero bias diode 21 and an output boost circuit 22. The zero bias diode 21, such as a Schottky diode, is not biased but is operated in a zero bias state and outputs a rectifying signal S2 according to a wireless signal S1 such as a radio frequency (RF) signal. The output boost circuit 22, such as a transduction device, is used for enhancing the intensity of the output current signal and comprises a zero bias transistor 222. The zero bias transistor 222, such as a field effect transistor, is not biased but is operated in a zero bias state and is coupled to the zero bias diode 21. The zero bias transistor 222 is used for enhancing the rectifying signal S2 to output a DC signal S3 such as a DC voltage or a DC current. A number of embodiments are disclosed below for elaborating the zero bias power detector 2 in greater details.

First Embodiment

Figure 3:
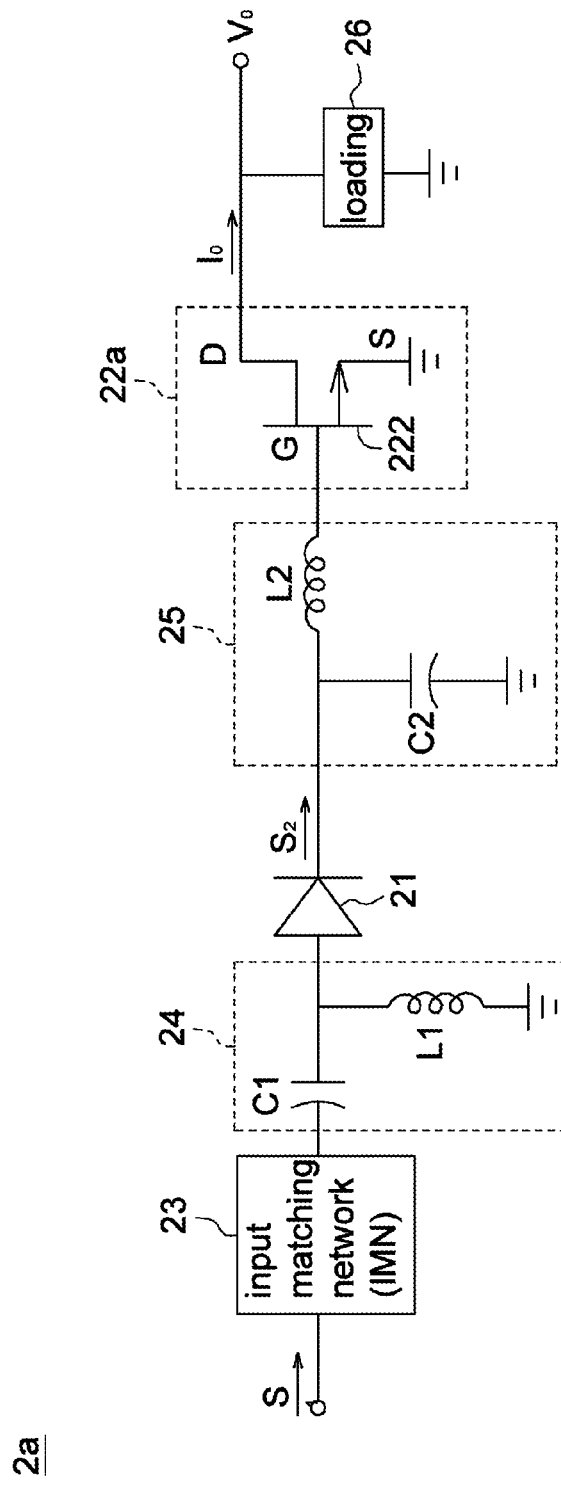
FIG. 3 shows a circuit diagram of a zero bias power detector according to a first embodiment.

Referring to FIG. 3, a circuit diagram of a zero bias power detector according to a first embodiment is shown. The zero bias power detector 2 is such as a co-source configuration, and the co-source configuration is such as the zero bias power detector 2a of FIG. 3. The zero bias power detector 2a comprises a zero bias diode 21, an output boost circuit 22a, an input matching network (IMN) 23, a DC blocking circuit 24, an AC blocking circuit 25 and a loading 26. The output boost circuit 22a comprises a zero bias transistor 222. The DC blocking circuit 24, coupled between the IMN 23 and the zero bias diode 21, is used for blocking the DC component of the wireless signal S1. The DC blocking circuit 24 comprises a capacitor C1 and an inductor L1. One terminal of the capacitor C1 is coupled to the IMN 23, and the other terminal of the capacitor C1 is coupled to the anode of the zero bias diode 21. One terminal of the inductor L1 is coupled to the other terminal of the capacitor C1 and the anode of the zero bias diode 21, and the other terminal of the inductor L1 is coupled to a ground terminal. The capacitor C1 isolates the DC component, and the inductor L1 guides the DC component to the ground terminal. Since the DC component of the wireless signal S1 can be isolated by the DC blocking circuit 24 in advance, the zero bias diode 21 can rectify the wireless signal S1 whose DC component is already isolated to output a rectifying signal S2. The rectifying signal S2 is such as a current.

The AC blocking circuit 25 is coupled between the zero bias diode 21 and the zero bias transistor 222 to block the AC component of the rectifying signal S2. The AC blocking circuit 25 comprises a capacitor C2 and an inductor L2. One terminal of the capacitor C2 is coupled to the cathode of the zero bias diode 21 and one terminal of the inductor L2, and the other terminal of the capacitor C2 is coupled to a ground terminal. The inductor L2 is coupled between the zero bias diode 21 and the zero bias transistor 222. The inductor L2 provides an RF choke function to the block high-frequency signal. The capacitor C2 guides the high-frequency signal to the ground terminal.

The gate of the zero bias transistor 222 is coupled to the other terminal of the inductor L2, and the source and drain of the zero bias transistor 222 are respectively coupled to a ground terminal and a loading 26 to form a co-source configuration. The zero bias transistor 222 enhances the rectifying signal S2 whose AC component is blocked to generate a DC output current Io, which can be converted into a DC output voltage Vo through a loading 26.

The zero bias transistor 222 is not biased but is operated in the zero bias state. However, due to the parasitic capacitor existing between the gate and the source of the zero bias transistor 222, the rectifying signal S2 still can charge the parasitic capacitor between the gate and the source of the zero bias transistor 222, and enhance the intensity of the current signal according to the transduction properties of the transistor. Thus, the zero bias diode 21 and the zero bias transistor 222 both can enhance the intensity of the signal outputted from the zero bias power detector 2a without having to be biased.

Figure 1:
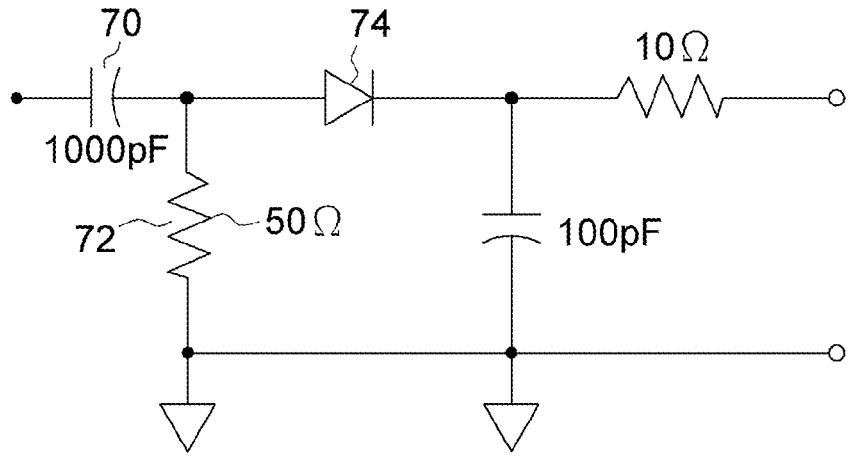
FIG. 1 shows a circuit diagram of a conventional zero bias power detector.
Figure 4:
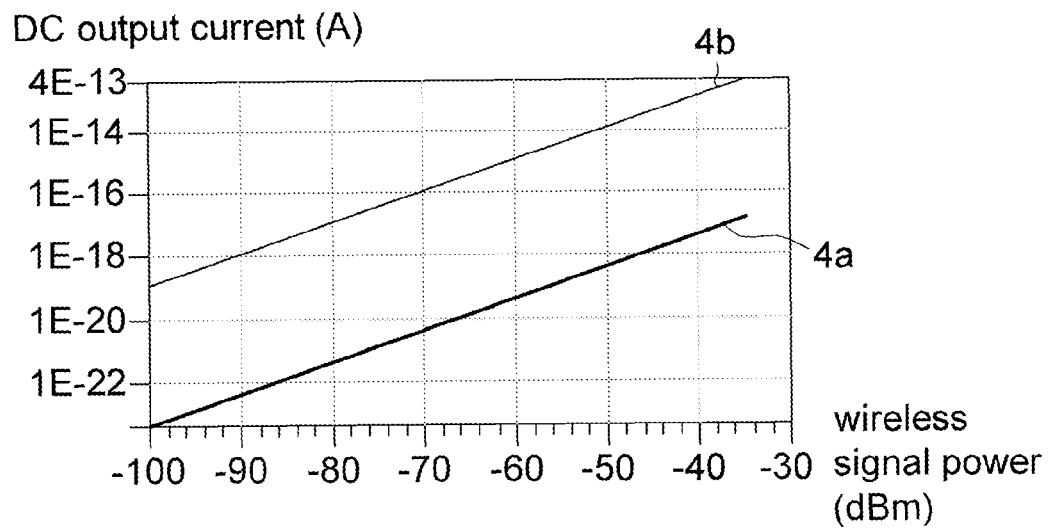
FIG. 4 shows an output current measurement chart of a zero bias power detector 2a and a conventional zero bias power detector.

Referring to FIG. 4, an output current measurement chart of a zero bias power detector 2a and a conventional zero bias power detector is shown. The output current of the conventional zero bias power detector of FIG. 1 is illustrated as the current curve 4a of FIG. 4, and the output current of the zero bias power detector 2a is illustrated as the current curve 4b of FIG. 4 s. The DC output current of the zero bias power detector proportionally increases with the wireless signal power. The comparison between the current curve 4a and the current curve 4b shows that the zero bias power detector 2a largely boots the DC output current.

Figure 5:
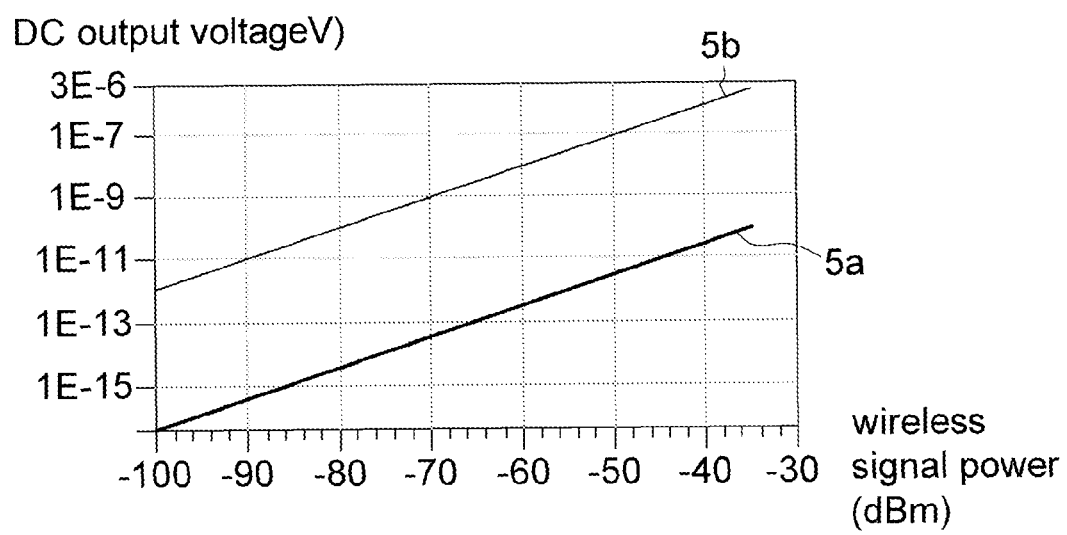
FIG. 5 shows an output voltage measurement chart of a zero bias power detector 2a and a conventional zero bias power detector.

Referring to FIG. 5, an output voltage measurement chart of a zero bias power detector 2a and a conventional zero bias power detector is shown. The output voltage of the conventional zero bias power detector of FIG. 1 is illustrated as the voltage curve 5a of FIG. 5, and the output voltage of the zero bias power detector 2a is illustrated as the voltage curve 5b of FIG. 5. The DC output current of the zero bias power detector can be converted into a DC output voltage through a loading, so the DC output voltage of the zero bias power detector proportionally increases with the wireless signal power. The comparison between the voltage curve 5a and the voltage curve 5b shows that the zero bias power detector 2a largely boots the DC output voltage.

Figure 6:
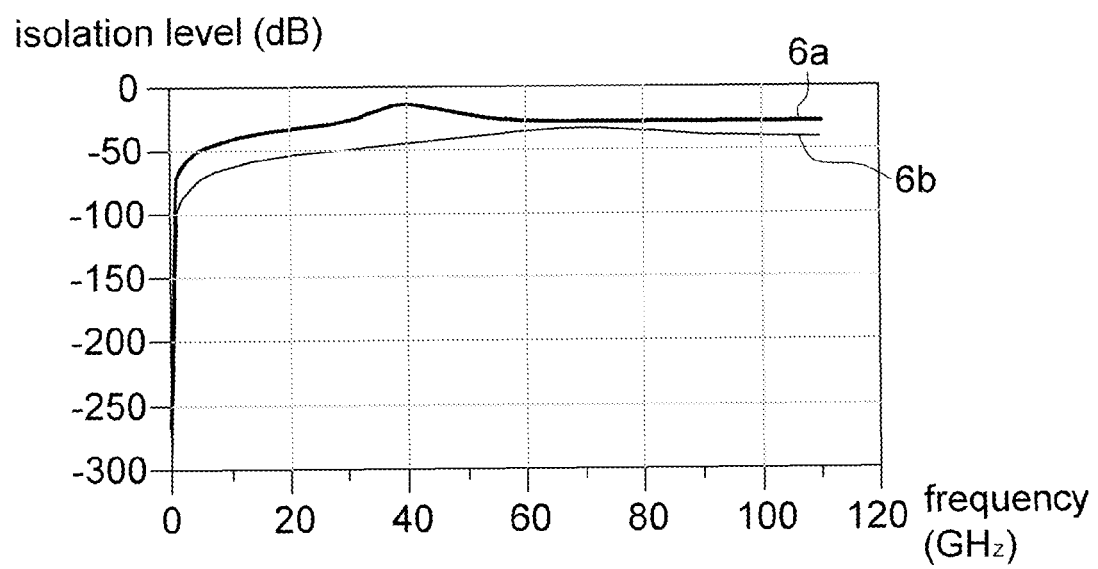
FIG. 6 shows an isolation measurement chart of a zero bias power detector 2a and a conventional zero bias power detector.

Referring to FIG. 6, an isolation measurement chart of a zero bias power detector 2a and a conventional zero bias power detector is shown. The isolation level of the conventional zero bias power detector of FIG. 1 is illustrated as isolation curve 6a of FIG. 6, and the isolation level of the zero bias power detector 2a is illustrated as the isolation curve 6b of FIG. 6. The comparison between the isolation curve 6a and the isolation curve 6b shows that the zero bias power detector 2a largely increases the isolation level.

Second Embodiment

Figure 7:
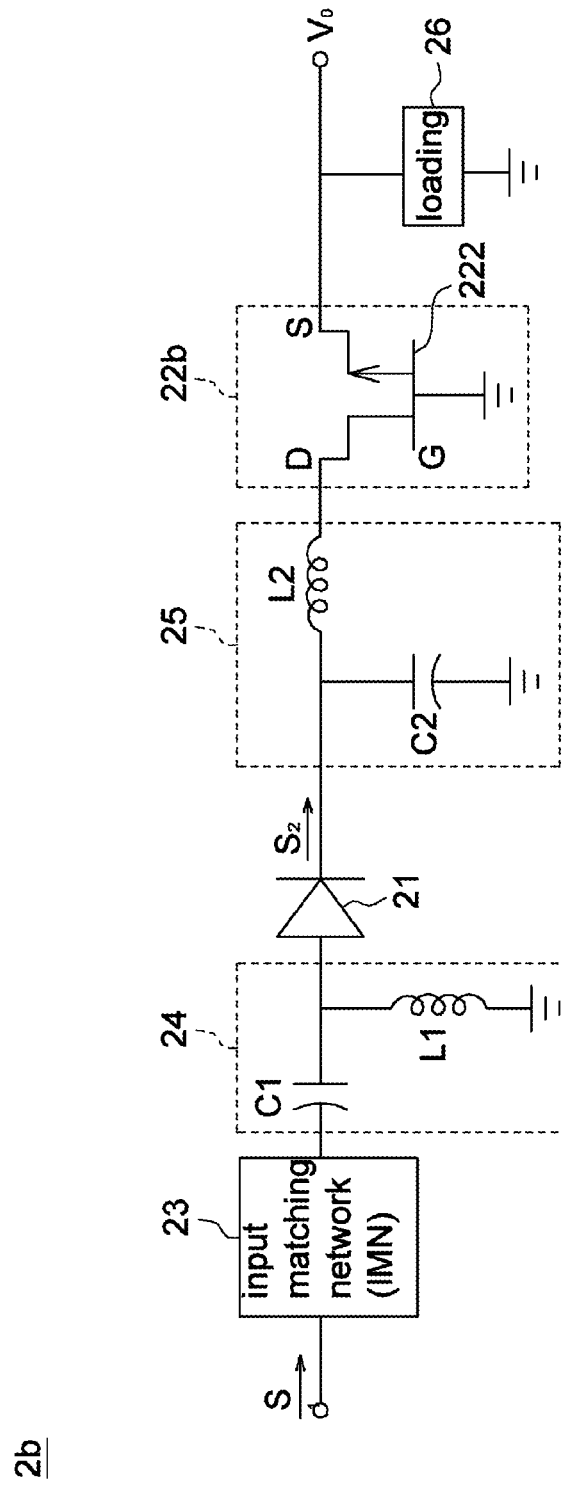
FIG. 7 shows a circuit diagram of a zero bias power detector according to a second embodiment.

Referring to FIG. 7, a circuit diagram of a zero bias power detector according to a second embodiment is shown. The zero bias power detector 2, such as a co-gate configuration, can be realized by the zero bias power detector 2b of FIG. 7. The zero bias power detector 2b is different from the zero bias power detector 2a in that the connection of the zero bias transistor 222 of the output boost circuit 22b is different from the connection of the zero bias transistor 222 of the output boost circuit 22a. The gate of the zero bias transistor 222 is coupled to a ground terminal, and the source and the drain of the zero bias transistor 222 are respectively coupled to the loading 26 and the other terminal of the inductor L2 to form the co-gate configuration.

The zero bias transistor 222 is not biased but is operated in the zero bias state. However, due to the parasitic capacitor existing between the gate and the source of the zero bias transistor 222, the rectifying signal S2 still can charge the parasitic capacitor between the gate and the source of the zero bias transistor 222, and enhance the intensity of the current signal according to the transduction properties of the transistor. Thus, the zero bias diode 21 and the zero bias transistor 222 both can enhance the intensity of the signal outputted from the zero bias power detector 2b without having to be biased.

Figure 8:
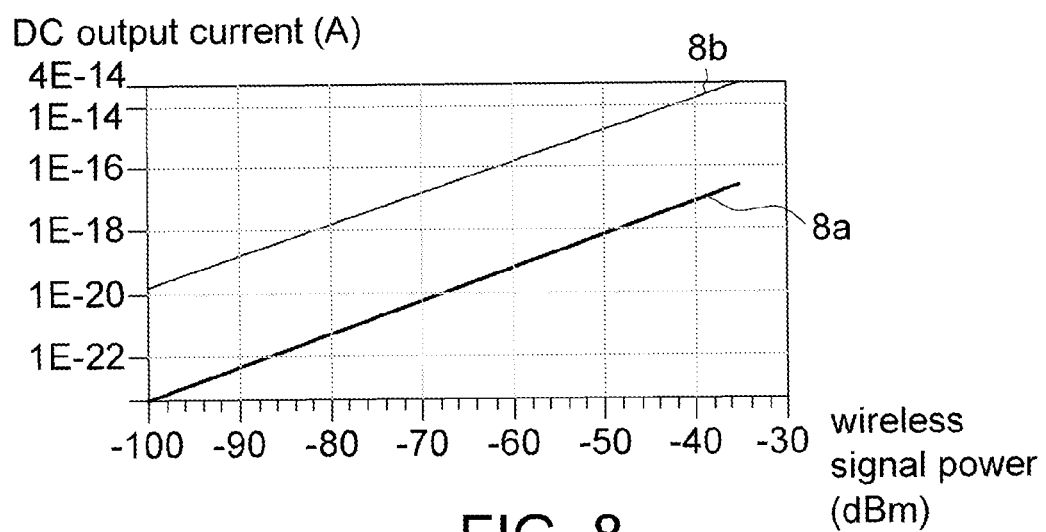
FIG. 8 shows an output current measurement chart of a zero bias power detector 2b and a conventional zero bias power detector.

Referring to FIG. 8, an output current measurement chart of a zero bias power detector 2b and a conventional zero bias power detector is shown. The output current of the conventional zero bias power detector of FIG. 1 is illustrated as the current curve 8a of FIG. 8, and the output current of the zero bias power detector 2b is illustrated as the current curve 8b of FIG. 8. The DC output current of the zero bias power detector proportionally increases with the wireless signal power. The comparison between the current curve 8a and the current curve 8b shows that the zero bias power detector 2b largely boots the DC output current.

Figure 9:
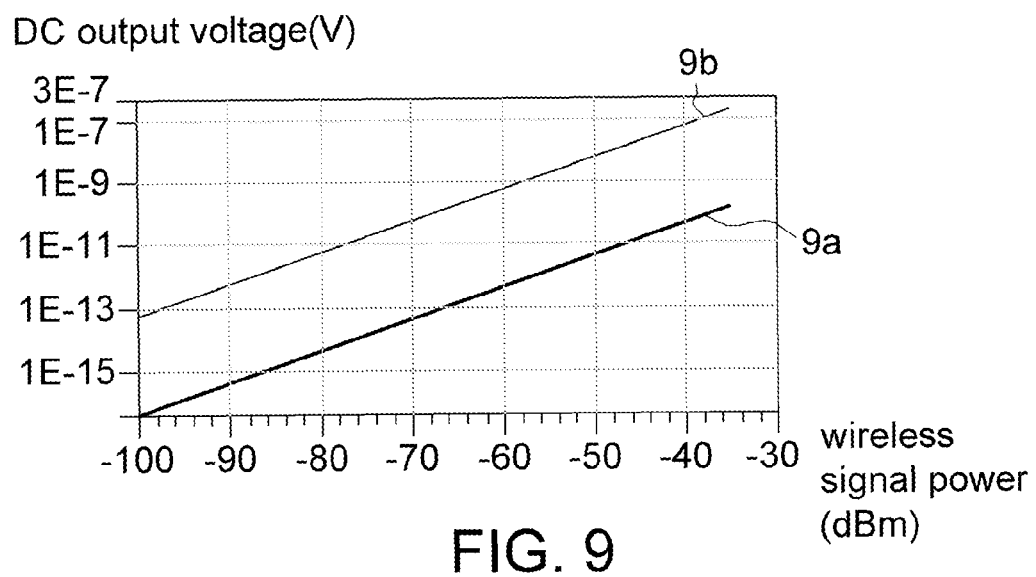
FIG. 9 shows an output voltage measurement chart of a zero bias power detector 2b and a conventional zero bias power detector.

Referring to FIG. 9, an output voltage measurement chart of a zero bias power detector 2b and a conventional zero bias power detector is shown. The output voltage of the conventional zero bias power detector of FIG. 1 is illustrated as the voltage curve 9a of FIG. 9, and the output voltage of the zero bias power detector 2b is illustrated as the voltage curve 9b of FIG. 9. The DC output current of the zero bias power detector can be converted into a DC output voltage through a loading, so the DC output voltage of the zero bias power detector proportionally increases with the wireless signal power. The comparison between the voltage curve 9a and the voltage curve 9b shows that the zero bias power detector 2b largely boots the DC output voltage.

Third Embodiment

Figure 10:
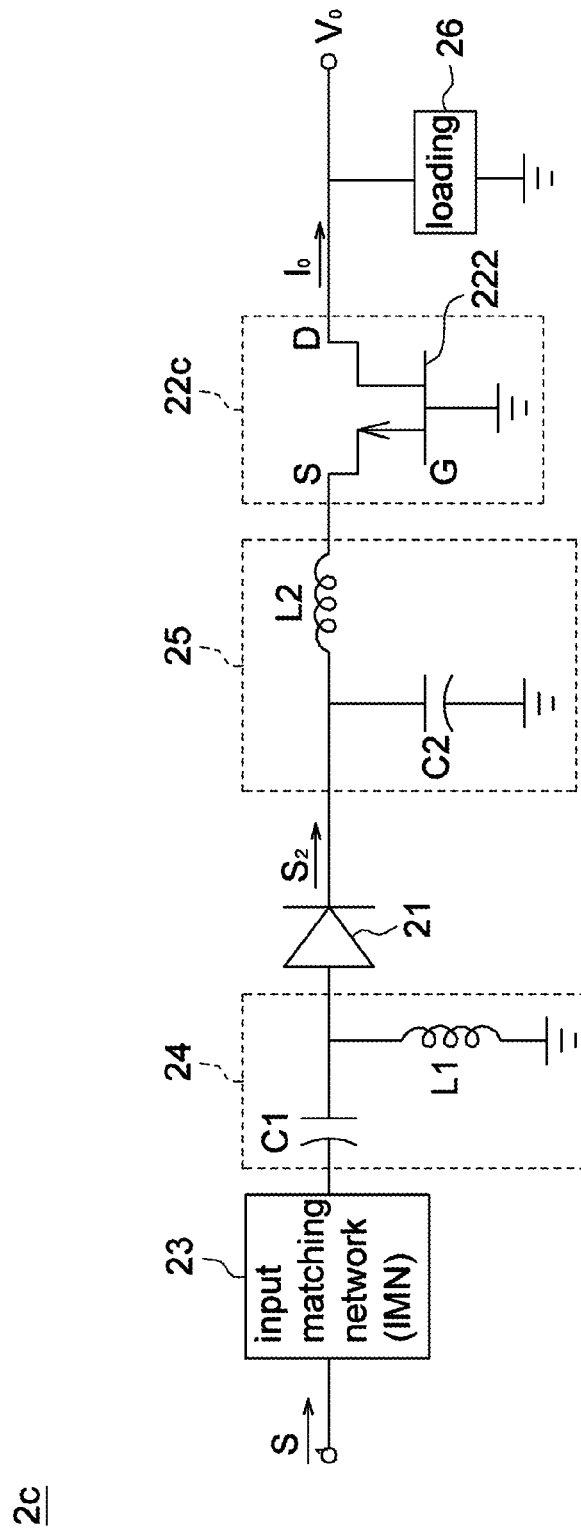
FIG. 10 shows a circuit diagram of a zero bias power detector according to a third embodiment.

Referring to FIG. 10, a circuit diagram of a zero bias power detector according to a third embodiment is shown. The zero bias power detector 2, such as a co-gate configuration, can be realized by the zero bias power detector 2c of FIG. 10. The zero bias power detector 2c is different from the zero bias power detector 2a in that the connection of the zero bias transistor 222 of the output boost circuit 22c is different from the connection of the zero bias transistor 222 of the output boost circuit 22c. The gate of the zero bias transistor 222 is coupled to a ground terminal, and the source and the drain of the zero bias transistor 222 are respectively coupled to the other terminal of the inductor L2 and the loading 26 to form the co-gate configuration.

The zero bias transistor 222 is not biased but is operated in the zero bias state. However, due to the parasitic capacitor existing between the gate and the source of the zero bias transistor 222, the rectifying signal S2 still can charge the parasitic capacitor between the gate and the source of the zero bias transistor 222, and enhance the intensity of the current signal according to the transduction properties of the transistor. Thus, the zero bias diode 21 and the zero bias transistor 222 both can enhance the intensity of the signal outputted from the zero bias power detector 2b without having to be biased.

Figure 11:
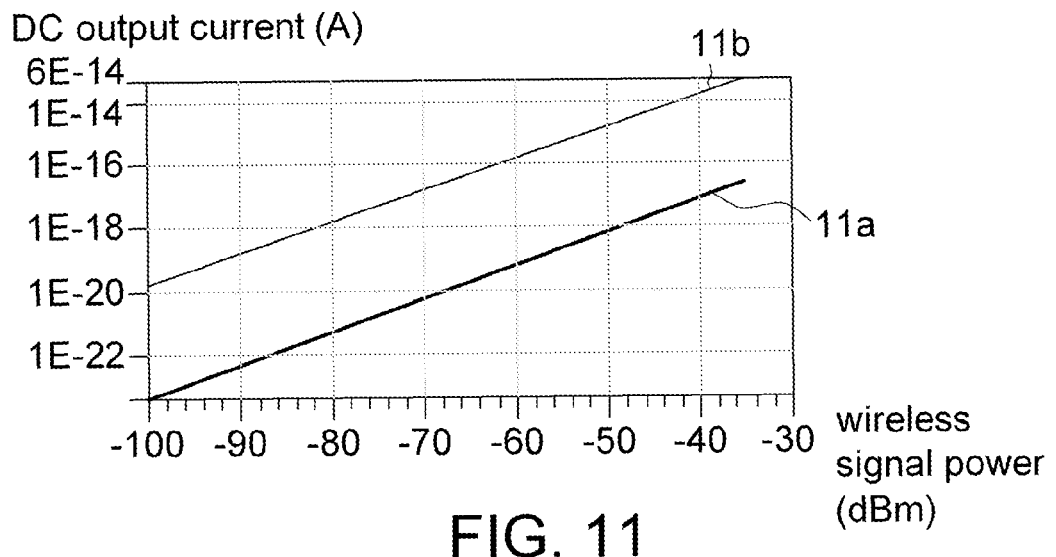
FIG. 11 shows an output current measurement chart of a zero bias power detector 2c and a conventional zero bias power detector.

Referring to FIG. 11, an output current measurement chart of a zero bias power detector 2c and a conventional zero bias power detector is shown. The output current of the conventional zero bias power detector of FIG. 1 is illustrated as the current curve 11a of FIG. 11, and the output current of the zero bias power detector 2c is illustrated as the current curve 11b of FIG. 11. The DC output current of the zero bias power detector the proportionally increases with the wireless signal power. The comparison between the current curve 11a and the current curve 11b shows that the zero bias power detector 2c largely boots the DC output current.

Figure 12:
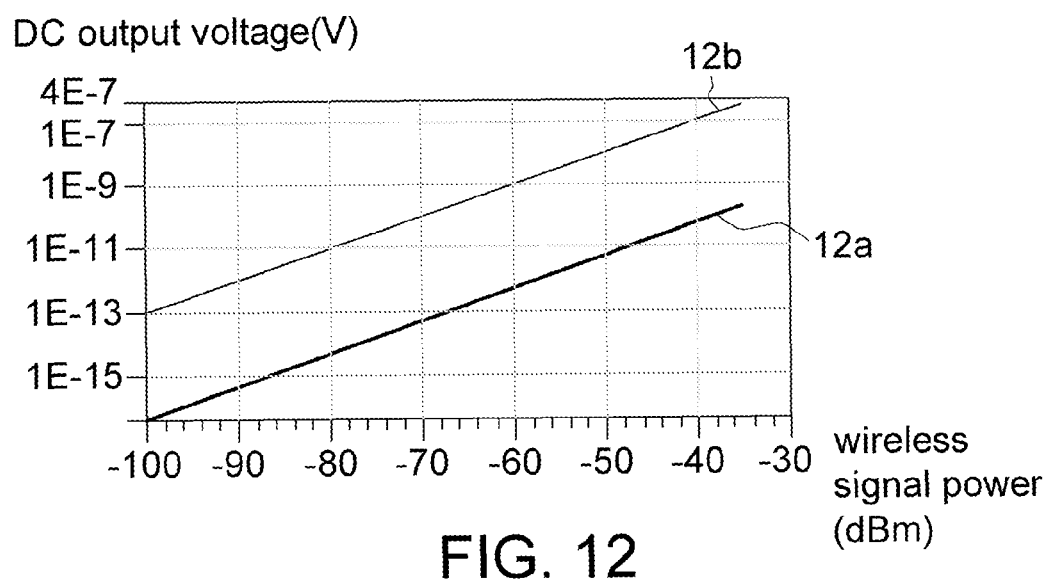
FIG. 12 shows an output voltage measurement chart of a zero bias power detector 2c and a conventional zero bias power detector.

Referring to FIG. 12, an output voltage measurement chart of a zero bias power detector 2c and a conventional zero bias power detector is shown. The output voltage of the conventional zero bias power detector of FIG. 1 is illustrated as the voltage curve 12a of FIG. 12, and the output voltage of the zero bias power detector 2c is illustrated as the voltage curve 12b of FIG. 12. The DC output current of the zero bias power detector can be converted into a DC output voltage through the loading, so the DC output voltage of the zero bias power detector proportionally increases with the wireless signal power. The comparison between the voltage curve 12a and the voltage curve 12b shows that the zero bias power detector 2c largely boots the DC output voltage.

A number of embodiments are disclosed above for elaborating the disclosure. No matter the co-source configuration or the co-gate configuration, any designs which integrate the zero bias diode and the zero bias transistor to detect the wireless power are within the scope of protection of the disclosure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A zero bias power detector, comprising: a zero bias diode, which outputs a rectifying signal according to a wireless signal; and an output boost circuit, comprising: a zero bias transistor, wherein the zero bias transistor, coupled to the zero bias diode, is used for enhancing the rectifying signal, wherein the control terminal of the zero bias transistor is coupled to the zero bias diode, a first terminal of the zero bias transistor is directly connected to only a loading, and a second terminal of the zero bias transistor is directly connected to only a ground terminal.

2. The zero bias power detector according to claim 1, further comprising:
   a DC blocking circuit coupled to the zero bias diode and used for blocking the DC component of the wireless signal.

3. The zero bias power detector according to claim 2, wherein the DC blocking circuit comprises:
   a capacitor coupled to the zero bias diode; and
   an inductor, wherein one terminal of the inductor is coupled to the capacitor and the zero bias diode, and the other terminal of the inductor is coupled to a ground terminal.

4. The zero bias power detector according to claim 1, further comprising:
   an AC blocking circuit coupled between the zero bias diode and the zero bias transistor for blocking the AC component of the rectifying signal.

5. The zero bias power detector according to claim 4, wherein the AC blocking circuit comprises:
   a capacitor coupled to the zero bias diode; and
   an inductor coupled between the zero bias diode and the zero bias transistor.

6. The zero bias power detector according to claim 1, wherein the control terminal of the zero bias transistor is realized by a gate, the first terminal of the zero bias transistor is realized by a drain, and the second terminal of the zero bias transistor is realized by a source.

7. The zero bias power detector according to claim 1, wherein the first terminal of the zero bias transistor is coupled to the zero bias diode, the control terminal of the zero bias transistor is coupled to a ground, and the second terminal of the zero bias transistor is coupled to a loading.

8. The zero bias power detector according to claim 7, wherein the control terminal of the zero bias transistor is realized by a gate, the first terminal of the zero bias transistor is realized by a drain, the second terminal of the zero bias transistor is realized by a source.

9. The zero bias power detector according to claim 7, wherein the control terminal of the zero bias transistor is realized by a gate, the first terminal of the zero bias transistor is realized by a source, and the second terminal of the zero bias transistor is realized by a drain.

* * * * *